United States Patent
Saladi et al.

(10) Patent No.: US 10,339,236 B2
(45) Date of Patent: Jul. 2, 2019

(54) TECHNIQUES FOR IMPROVING COMPUTATIONAL THROUGHPUT BY USING VIRTUAL MACHINES

(71) Applicant: VMware, Inc., Palo Alto, CA (US)

(72) Inventors: Kalyan Saladi, Sunnyvale, CA (US); Aravind Pavuluri, Menlo Park, CA (US); Nikhil Bhatia, Santa Clara, CA (US)

(73) Assignee: VMware, Inc., Palo Alto, CA (US)

( * ) Notice: Subject to any disclaimer, the term of this patent is extended or adjusted under 35 U.S.C. 154(b) by 298 days.

(21) Appl. No.: 14/023,293

(22) Filed: Sep. 10, 2013

(65) Prior Publication Data

US 2015/0074662 A1    Mar. 12, 2015

(51) Int. Cl.
*G06F 17/50* (2006.01)
*G06F 9/455* (2018.01)

(52) U.S. Cl.
CPC ...... *G06F 17/5022* (2013.01); *G06F 9/45558* (2013.01); *G06F 2009/45562* (2013.01)

(58) Field of Classification Search
CPC .................................................. G06F 17/5022
See application file for complete search history.

(56) References Cited

U.S. PATENT DOCUMENTS

| | | | |
|---|---|---|---|
| 8,677,355 B2* | 3/2014 | Spradlin | G06F 11/3636 703/23 |
| 2004/0221290 A1* | 11/2004 | Casey et al. | 718/104 |
| 2011/0252278 A1* | 10/2011 | Kanno | G06F 11/3668 714/38.1 |
| 2011/0321040 A1* | 12/2011 | Sobel | G06F 21/53 718/1 |
| 2014/0149718 A1* | 5/2014 | Hughes et al. | 712/208 |
| 2014/0351233 A1* | 11/2014 | Crupi | G06F 17/30516 707/706 |

* cited by examiner

*Primary Examiner* — Lewis A Bullock, Jr.
*Assistant Examiner* — Melissa A Headly
(74) *Attorney, Agent, or Firm* — Thomas Horstemeyer, LLP

(57) ABSTRACT

A computer implemented method receives a request to run a group of instruction sets. Each instruction set is associated with a sequence of common instructions. The method executes the sequence of common instructions in a first virtual machine (VM) to generate a result which is stored in a first memory associated with the first VM. The method then clones a second VM that shares the first memory with the first VM. The method continues by executing a first instruction set in the second VM. Since the second VM shares memory with the first VM, the second VM can use the result stored in the first memory and the sequence of common instructions does not need to be executed on the second VM. In one example, the result is a run-time model of a circuit and the second VM runs the first instruction set on the run-time model.

23 Claims, 6 Drawing Sheets

TECHNIQUES FOR IMPROVING COMPUTATIONAL THROUGHPUT BY USING VIRTUAL MACHINES

BACKGROUND

Manufacturing a silicon chip is a complex process that requires many precisely controlled steps. Typically, the design flow for manufacturing the chip includes logical synthesis, timing analysis, place and route, and verification. Out of these steps, verification is generally the most resource and time intensive step in the design flow. A computer system performs the verification by running various simulations to test the design of chip. These simulations can include functional verification, timing verification, and physical verification.

In order to simulate a design, a source language specification is compiled and elaborated to create a run-time representation of the chip in memory. The computer system initializes a memory model and performs a reset sequence before the test vector drives the model into a unique path. The verification process may include many test vectors, which each perform the reset sequence. This process is both memory intensive and time consuming. For example, in total, the verification process can take upwards of 70% of the entire design cycle as each simulation takes a large amount of time to run partly due to having to generate the in-memory representation of the chip for each test vector. As technology improves and chip designs increase in complexity, the simulations will increase in number and complexity thereby making the verification step a larger bottleneck in the design flow.

SUMMARY

In one embodiment, a computer implemented method receives a request to run plurality of instruction sets where each instruction set is associated with a sequence of common instructions. The method further executes the sequence of common instructions in a first virtual machine (VM). Executing at least a portion of the sequence of the common instructions generates a first result. The method then stores the first result in a first memory associated with the first VM. The method then determines a point to clone a second VM, followed by cloning the second VM where the second VM shares the first memory with the first VM. The method then executes a first instruction set from the plurality of instruction sets in the second VM where the first instruction set uses the first result.

In another embodiment, a non-transitory computer readable storage medium contains instructions, that when executed, control a computer system to be configured for receiving a request to run a plurality of instruction sets where each instruction set is associated with a sequence of common instructions. The instructions execute the sequence of common instructions in a first virtual machine (VM) where at least a portion of the sequence of the common instructions generates a first result. The instructions then store the first result in a first memory associated with the first VM. The instructions then determine a point to clone a second VM, followed by cloning the second VM where the second VM shares the first memory with the first VM. The instructions then execute a first instruction set from the plurality of instruction sets in the second VM where the first instruction set uses the first result.

In another embodiment, an apparatus comprises one or more computer processors and a non-transitory computer-readable storage medium comprising instructions, that when executed, control the one or more computer processors to be configured for receiving a request to run a plurality of instruction sets, each instruction set being associated with a sequence of common instructions. The instructions further include executing the sequence of common instructions in a first virtual machine (VM) where at least a portion of the sequence of the common instructions generates a first result. The instructions then store the first result in a first memory associated with the first VM. The instructions then determine a point to clone a second VM, followed by cloning the second VM where the second VM shares the first memory with the first VM. The instructions then execute a first instruction set from the plurality of instruction sets in the second VM where the first instruction set uses the first result.

The following detailed description and accompanying drawings provide a better understanding of the nature and advantages of particular embodiments.

DETAILED DESCRIPTION

In the following description, for purposes of explanation, numerous examples and specific details are set forth in order to provide a thorough understanding of particular embodiments. Particular embodiments as defined by the claims may include some or all of the features in these examples alone or in combination with other features described below, and may further include modifications and equivalents of the features and concepts described herein.

Techniques are described for improving the verification process of a circuit model. A computer system can create a parent virtual machine (VM). The parent VM executes a sequence of commands that are shared amongst a plurality of tests to set up a model. The sequence of commands performs a first set of steps, such as an initialization sequence or reset sequence that may be common to each of the tests. After completion of the sequence of commands, the computer system can fork a clone VM (e.g., using a VMFork command) to run a test from the plurality of tests. The computer system may call the VMFork command at an optimal point, also known as an application hook. The computer system can determine the application hook upon completion of the sequence of commands or upon determination that a predefined memory allocation, either on the parent VM or the computer system, has been reached. The clone VM may share state with the parent VM. For example, the clone VM may share the same memory as the parent VM that includes the model. The clone VM then runs the test on the model. At a later point in time when the clone VM may alter the model while running the test, then the computer system creates memory for the clone VM such that the model created by the parent VM is not altered. This allows the model stored by the parent VM to remain unchanged allowing other tests that need to execute the set of commands to leverage the model and not have to generate the model. The above process uses a much smaller memory footprint due to sharing of the memory of the model. Also, the process improves runtime throughput due to the model being generated only once by the parent VM, and not in each clone VM.

Figure 1:
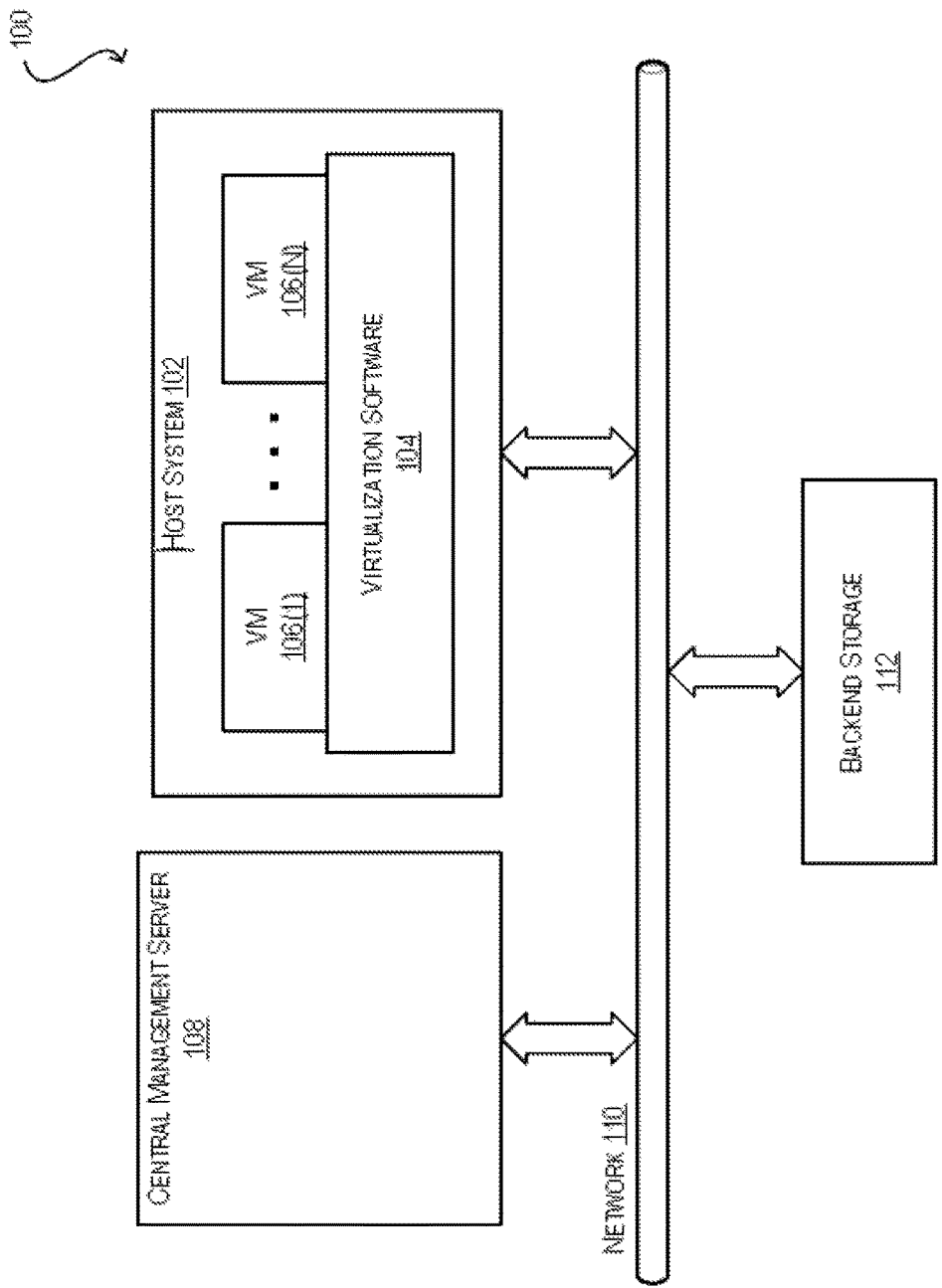
FIG. 1 depicts a virtual infrastructure for performing a verification process according to one embodiment.

FIG. 1 depicts an example of a virtual infrastructure 100 for performing a verification process according to one embodiment. As shown, virtual infrastructure 100 includes a host system 102 that executes virtualization software 104. Virtualization software 104 (also known as a "hypervisor") is a software layer that provides an environment in which one or more deployed VMs 106(1)-106(N) can run. In one embodiment, virtualization software 104 can interact directly with the hardware platform of host system 102 without an intervening host operating system. In this embodiment, virtualization software 104 can include a kernel (not shown) that manages VM use of the various hardware devices of host system 102. In an alternative embodiment, virtualization software 104 can be part of a "hosted" configuration in which virtualization software 104 runs on top of a host operating system (not shown). In this embodiment, virtualization software 104 can rely on the host operating system for physical resource management of hardware devices. One of ordinary skill in the art will recognize various modifications and alternatives for the design and configuration of virtualization software 104.

Virtual infrastructure 100 also includes a central management server (CMS) 108 that communicates with host system 102 via a network 110. CMS 108 can perform various management tasks with respect host system 102 and VMs 106(1)-106(N), such as VM lifecycle management, hardware monitoring, load balancing, and so on. Although only a single host system is shown in FIG. 1, it should be appreciated that CMS 108 can simultaneously manage a large number of host systems (each comprising multiple VMs), such as all of the host systems in a virtual infrastructure cluster.

Each VM 106(1)-106(N) running on host system 102 can execute a guest OS and one or more software applications (e.g., databases, business applications, etc.). In one embodiment, the one or more software applications can correspond to one or more software services that the owner/administrator of virtual infrastructure 100 offers to remote users (e.g., customers). The software code (e.g., binaries, configuration files, etc.) for the guest OS and the one or more software applications can be maintained in virtual disks, or "VMDKs," that are stored in a backend storage device, such as backend storage 112.

Each VM can also execute a clone command to clone a VM (e.g., VMFork command). Executing the clone command in a parent VM creates a clone VM that is associated with the parent VM. By way of virtualization, the clone VM can share pages of memory that belong to the parent VM through indirection. Therefore an attempt to access an unaltered page of memory by the clone VM will result in a redirection to the page of memory in the parent VM. When execution in the clone VM results in a potential change to the memory of the parent VM, the change can be stored as a delta of the parent VM's memory that is associated with the clone VM. As a result, the memory footprint of the parent VM and the clone VM is minimized through memory sharing. Moreover, the time required to generate two VMs having the same stateful execution point is minimized since the clone VM, when generated, is automatically at the same state as the parent VM. As discussed below, the command can be utilized along with an application hook to improve the computational throughput of a computer system that is performing a verification process.

Figure 2A:
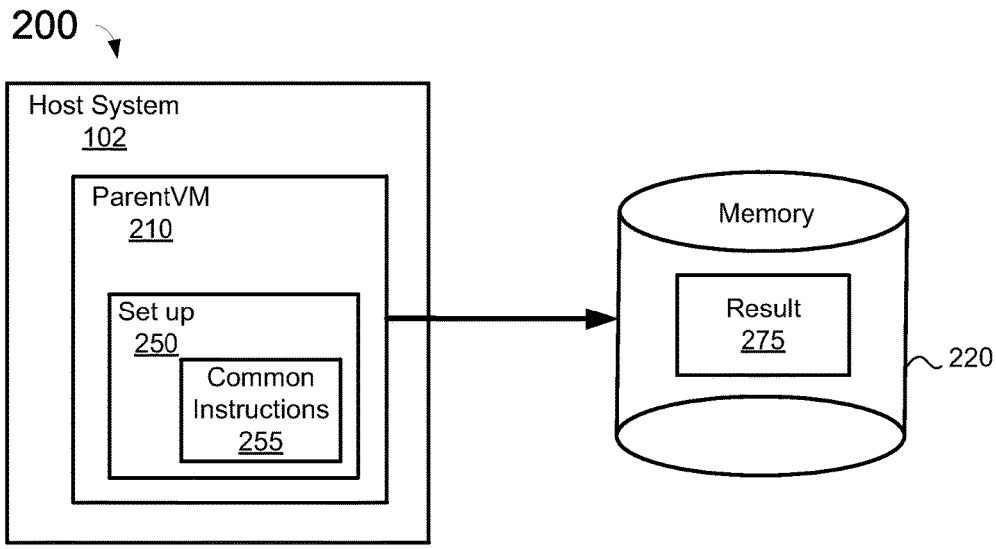
FIG. 2A depicts a system for executing a plurality of instruction sets according to one embodiment.

FIG. 2A depicts an example of a system for executing a plurality of instruction sets according to one embodiment. System 200 includes host system 102. Host system 102 can create parent VM 210 to generate a result by running set up suite 250. Set up suite 250 can include a sequence of common instructions 255. Sequence of common instructions 255 can be associated with each instruction set in a plurality of instruction sets (e.g., jobs, test vectors). The association can be that each instruction set depends on the results of executing the sequence of common instructions or that each instruction set includes the sequence of common instructions. Either way, execution of an instruction set from the plurality of instruction sets can require the results from executing the sequence of common instructions. In one specific example, the results can be a framework or infrastructure on which the instruction set is run on. In another example, the results can be a model that the instruction set is run on. The model can be a run-time model of a circuit in which verification is being performed. The common instructions can also generate a model, initialize an existing model, or reset an existing model. In yet another example, the common instructions can initialize entries of a database before the instruction set is executed.

Parent VM 210 performs the common instructions 255 to generate result 275. Host system 102 stores result 275 in memory 220, such as in memory pages associated with parent VM 210. Once the common instructions have been performed, parent VM 210 can remain in a steady state so that the state of result 275 remains unchanged for use by any clone VMs that are created. For instance, host system 102 can avoid issuing any additional commands to parent VM 210 after executing common instructions 255. Keeping the state of parent VM 210 unchanged allows clone VMs 230 to leverage result 275 when executing instruction sets that are configured to be run on the results. Upon executing common instructions 255, host system 102 generates clone VMs to execute other instruction sets.

Figure 2B:
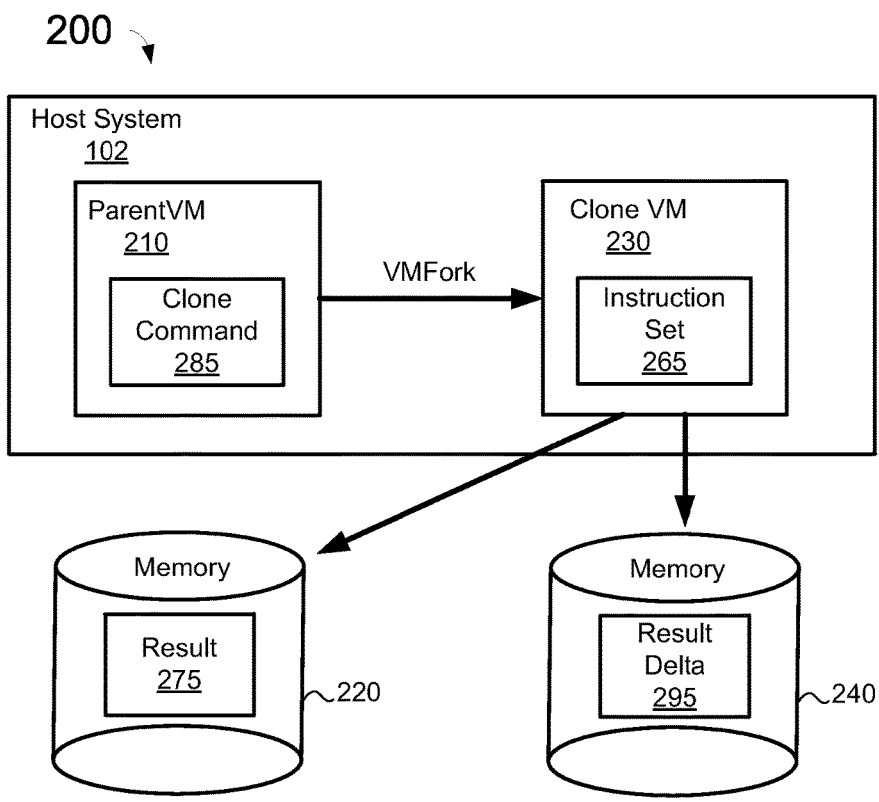
FIG. 2B depicts a system for executing an instruction set using a clone VM according to one embodiment.

FIG. 2B depicts an example of a system for executing an instruction set using clone VM 230 according to one embodiment. At some point, parent VM 210 executes a clone command to clone (e.g., a VMFork command) a clone VM 230. The point will be referred to as an application hook, but can be any command that causes generation of a clone VM 230. Also, although only one clone VM 230 is shown, parent VM 210 may execute multiple commands to generate multiple clone VMs. Each clone VM 230 can execute an instruction set. The instruction sets can all belong to a test suite. For example, host system 102 generates a clone VM 230 to execute instruction set 265.

Parent VM 210 executes a clone command 285 to create a clone VM 230. As shown, clone VM 230 can be generated on the host system 102; however in other examples, clone VM 230 may be generated on another host system (not shown). Whether generated on host system 102 or another host system, clone VM 230 shares memory 220 with parent VM 210. Thus, clone VM 230 can access result 275 from memory 220.

As discussed above, instruction set 265 in clone VM 230 may have to generate result 275 as all instruction sets have to before execution. The generation may be performed in a reset or initialization phase of the instruction set. In another example, the common instructions may be a part of the instruction set. Instead of regenerating result 275, clone VM 230 can execute the instruction set on the results stored in memory 220.

As clone VM 230 executes the instruction set, the execution may update result 275. For example, the executing of different steps in instruction set 265 can alter result 275 thus causing generation of a result delta 295. Due to many clone VMs 230 being generated and executing other instruction set 265 that leverage result 275, particular embodiments do not update result 275 stored in memory 220. Rather, host 102 stores potential changes to result 275 in memory 240 that is associated with clone VM 230. For example, memory 240 stores result delta 295 of result 275. Also, host 102 may make memory 240 private to clone VM 230 such that other clone VMs 230 running other instruction sets do not disturb result delta 295 stored in memory 240.

For each instruction set, parent VM 210 can fork a clone VM 230 that can execute each respective instruction set using result 275 stored in memory 220. Using the clone command from parent VM 210 allows the clone VM to share state with parent VM 210. Leveraging these aspects of the clone command allows clone VMs to execute an instruction set without performing initialization and reset steps that are required by all instruction sets. Rather, the instruction set executes by using result 275.

Figure 3A:
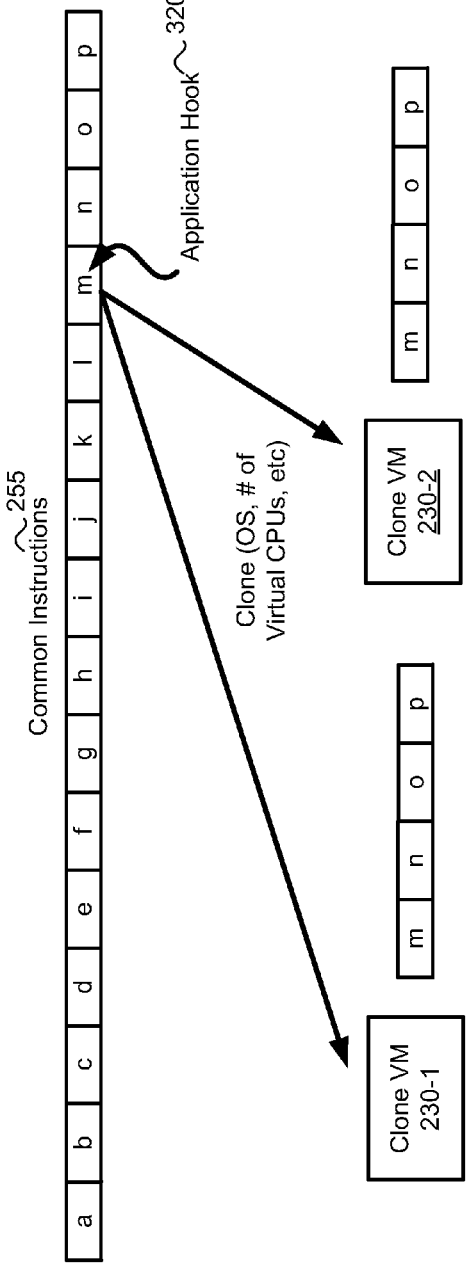
FIG. 3A depicts detecting the application hook prior to completion of executing common instructions according to one embodiment.
Figure 3B:
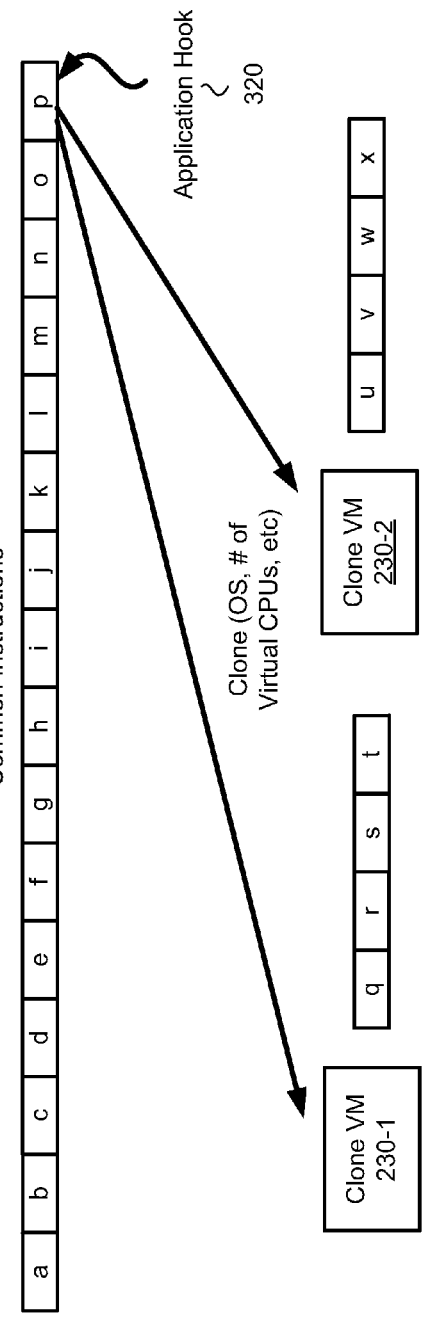
FIG. 3B depicts executing common instructions to completion before performing the application hook according to one embodiment.

FIGS. 3A and 3B depict an example of performing common instructions according to one embodiment. Common instructions 250 include instructions a-p. Execution of instructions a-p creates result 275, and as described above each instruction set needs to create result 275 during an initialization and reset procedure. At some point during execution of common instructions 255, parent VM 210 detects an application hook 320 that causes a fork to create one or more clone VMs 230. For purposes of discussion, it is assumed in this example that the application hook is determined by parent VM 210; however it is understood that the application hook can also be determined by some other VM or host system 102 (e.g., the hypervisor of host system 102).

Parent VM 210 can determine the application hook 320 at different times during execution of the common instructions 255. For example, parent VM 210 determines the application hook at the completion of common instructions 255. However, it is possible that parent VM 210 determines the application hook at other points of the processing, such as before the entire result 275 is completed. For example, parent VM 210 can determine the application hook based on the state of the resources available at host 102 or at parent VM 210.

FIG. 3A depicts an example of detecting the application hook prior to completion of executing common instructions 255 according to one embodiment. In this example, parent VM 210 performs the fork before result 275 is completed. In one embodiment, parent VM 210 detects application hook 320 when a predefined allocation of memory assigned to parent VM 210 has been reached. For instance, parent VM 210 detects the application hook 320 when parent VM 210 runs out of available memory associated with the VM 120. Although host system 102 that created parent VM 210 still has available memory, the memory allocated to parent VM 210 has been reached. In another embodiment, parent VM 210 detects application hook 320 when a predefined allocation of memory on host system 102 has been reached. Thus, detecting the application hook depends on the available memory of host system 102 rather than the memory allocated to parent VM 210.

As shown, application hook 320 is performed at instruction m. Parent VM 210 performs a clone command ("Clone (OS, # of Virtual CPUs, etc.)") to generate clone VM 230-1 and clone VM 230-2. As shown here, the clone command can include a plurality of configuration settings to personalize the creation of each clone VM. Configuration settings can include the operating system in which the clone VM should run on, the number of virtual CPUs that should be assigned to the clone VM, the particular host system in which the clone VM should be generated on, and others. These personalization settings can optimize the performance of the system by allocating resources properly to maximize performance or offer customizability to the system. For example, while 8 virtual CPUs may be optimal for setting up a circuit model, each test that is performed on the circuit model may require only one virtual CPU. As a result, the virtual CPUs can be assigned to the tests based on the need or the specification of the test. If a certain test only requires one virtual CPU, only one virtual CPU is assigned. In contrast, if a certain test is more computationally intensive and requires two virtual CPUs, two virtual CPUs can be assigned. Clone VM 230-1 and clone VM 230-2 can be generated based on the one or more VMFork commands.

Because parent VM 210 has not completed all the common instructions needed to generate the full result 275 before receiving application hook 320, clone VM 230-1 and clone VM 230-2 need to execute instructions m, n, o, p. Although clone VM 230-1 and clone VM 230-2 still need to execute some instructions of the initialization and reset procedure, clone VM 230-1 and clone VM 230-2 avoid executing many of the instructions of the initialization and reset procedure. Further, after executing instructions m-p to finish generating result 275, clone VM 230-1 and clone VM 230-2 may execute other instructions of their respective instruction sets. Even though clone VM 230-1 and clone VM 230-2 are performing the same instructions in common instructions 255, if any of these instructions m-p change result 275, then the changes are stored in respective memory 240 associated with the respective clone VM 230-1 and clone VM 230-2. This keeps the result 275 generated by parent VM 210 in the same state and thus parent VM 210 can fork additional clone VMs 230 that use result 275.

In another embodiment, parent VM 210 can determine application hook 230 after completion of common instructions 255. FIG. 3B depicts an example of executing common instructions 255 to completion before performing the application hook according to one embodiment. This scenario can be when both the parent VM 210 and host system 102 have sufficient memory to complete execution of common instructions a-p. In this scenario, the common instructions are completed and clone VM 230-1 and clone VM 230-2 can share the resulting result 275.

Here, the application hook has been detected during completion of the "p" instruction in common instructions 255. As a result, parent VM 210 executes a clone command ("Clone(OS, # of Virtual CPUs, etc.)") to generate clone VM 230-1 and clone VM 230-2. Because parent VM 210 completed generation of result 275, clone VM 230-1 and clone VM 230-2 do not need to execute any instructions of common instructions 255. For example, clone VM 230-1 executes commands q, r, s, t, etc. for a first instruction set and clone VM 230-2 executes commands u, v, w, x, etc. for a second instruction set. Once again, if any of these other commands change result 275, then the changes are stored in respective memory 240 associated with the respective clone VM 230-1 and clone VM 230-2. As mentioned above, the clone command can be personalized to include a plurality of configuration settings to personalize the creation of clone VMs. For example, the clone VMs can be personalized according to their respective workload requirements. The workload requirements can be vary depending on the instruction set.

Figure 4A:
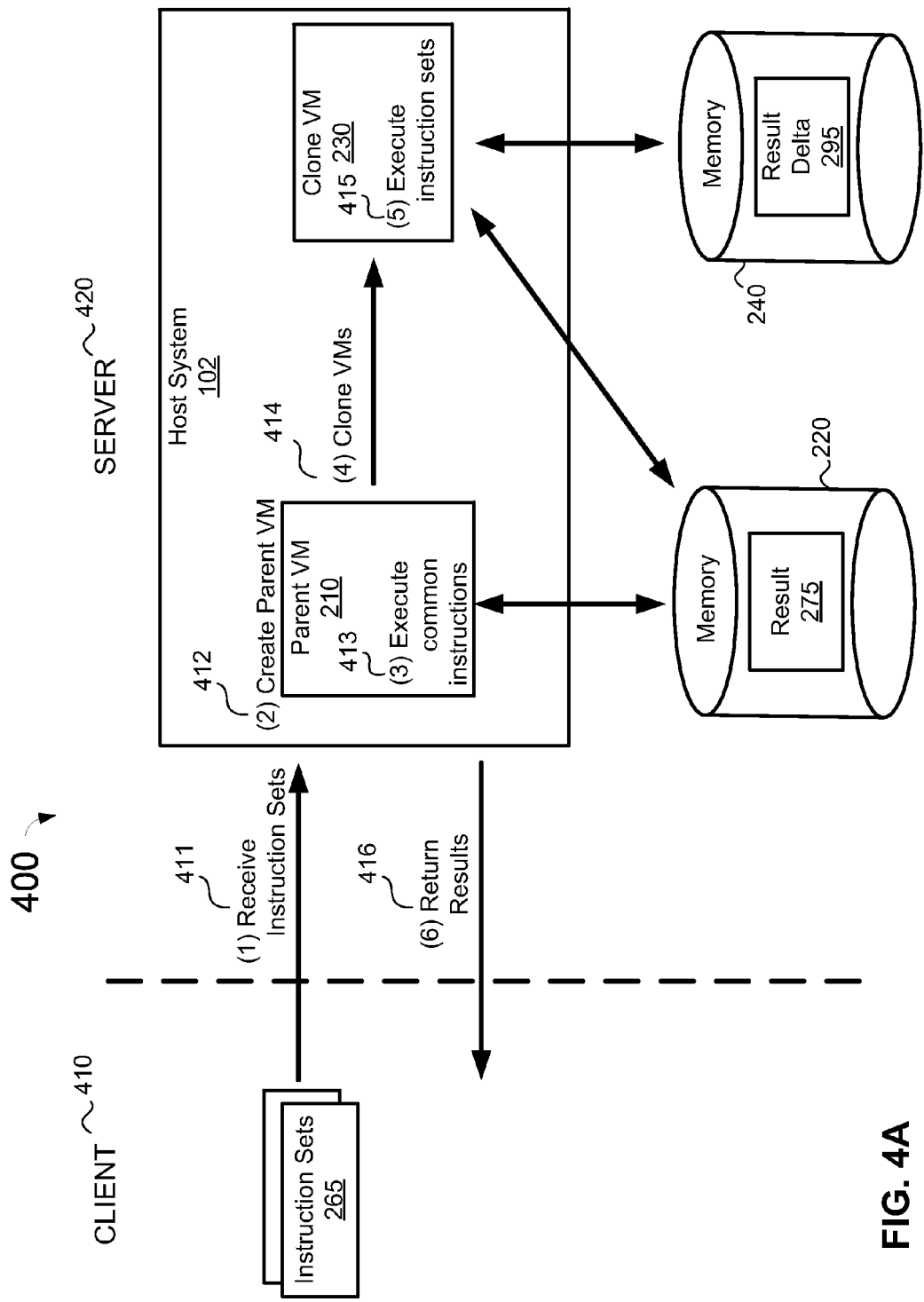
FIG. 4A depicts a system for servicing instruction sets according to one embodiment.

Particular embodiments may be implemented in a client-server model in different ways. One way includes a client submitting a plurality of instruction sets to a server for processing. The plurality of instruction sets can be test suite containing a plurality of test vectors. Each test vector can be for verifying a chip design. In another embodiment, a service model can be set up where the server waits for new instruction sets to come in. When an instruction set is detected, a VM is forked to create a clone VM for running the instruction set. FIG. 4A depicts an example of a system for servicing instruction sets according to one embodiment. System 400 is a client-server model where client 410 submits instruction sets for processing by server 420. For example, central management server 108 may be the client 410 that coordinates the instructions with host 102.

Server 420 receives instruction sets 265 at 411. Once the instruction sets are received, host system 102 creates parent VM 210 at 412. Parent VM 210 can be configured to generate a steady state of a result for which other clone VMs can be forked from. The result can be a model, an infrastructure, or initialization of entries in a database, to name a few. Once host 102 creates parent VM 210, the common instructions can be executed on parent VM 210 at 413. Execution of the common instructions generates result 275 in memory 220. Parent VM 210 sets the application hook once the result 275 has been generated. Host system 102 can proceed by forking a clone VM 230 for each instruction set from instruction sets 265 at 414. Each clone VM 230 executes a respective instruction set from instruction sets 265 at 415. Each clone VM 230 has the advantage of using result 275 as a starting point, thus reducing memory usage and improving run-time performance of host system 102. If changes to result 275 occurs from executing a test vector, a result delta 295 is saved in a memory 240 that is associated with the clone VM. Once execution of the instruction sets has been concluded, host system 102 gathers the results from the execution and returns the results to client 410 at 416.

Figure 4B:
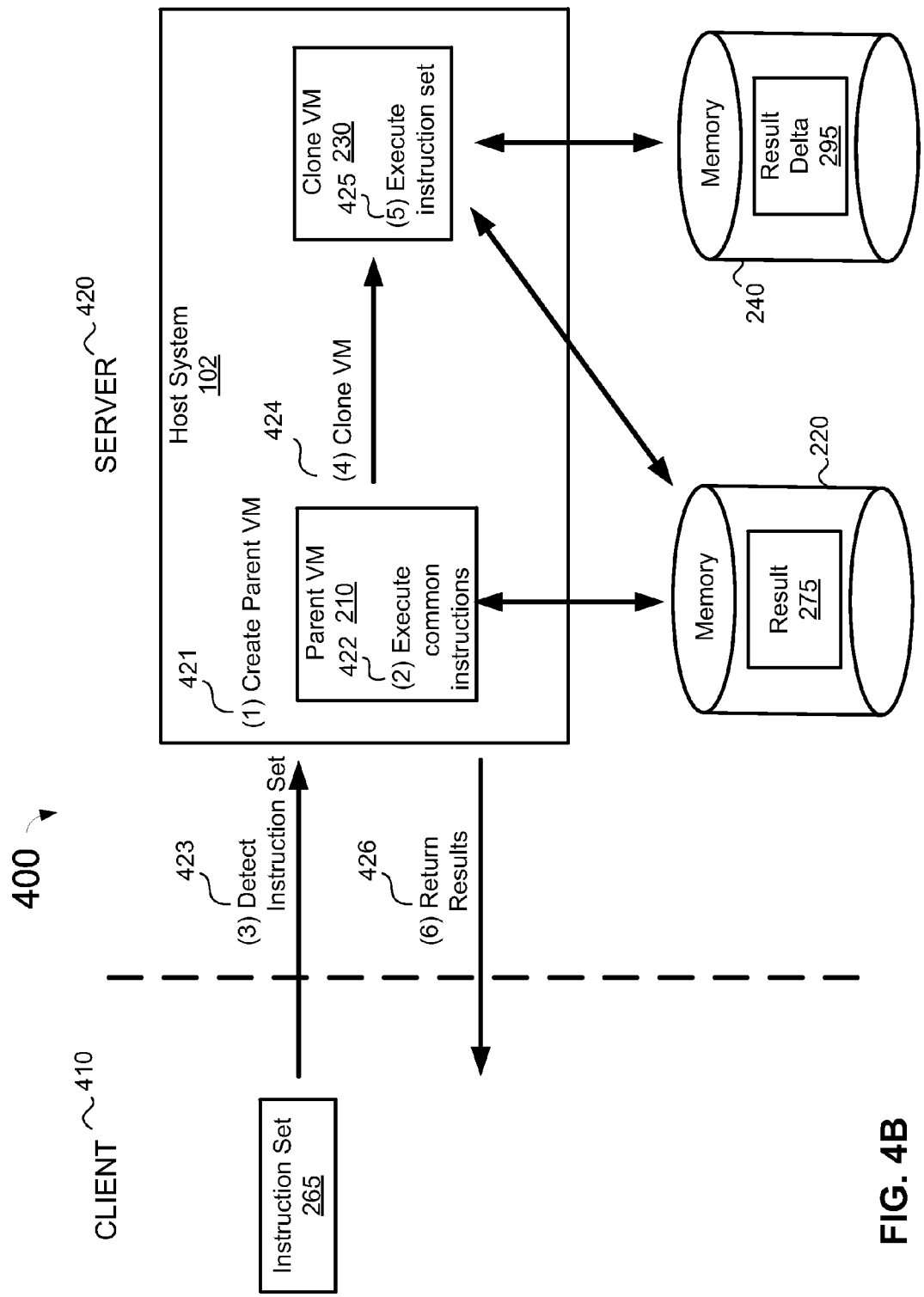
FIG. 4B depicts another system for servicing instruction sets according to one embodiment.

FIG. 4B depicts an example of a system for servicing instruction sets according to one embodiment. The instruction sets can be test vectors to be performed on a run-time model. System 400 is a client-server model where server 420 initializes a result and then waits to receive an instruction set (e.g., test vector) from client 410. As described above, central management server 108 may be client 410 that coordinates the process with host 102. Server 420 includes host system 102. Host system 102 can initialize server 420 to receive client instruction sets by creating a parent VM 210 at 421. Once parent VM 210 has been created, parent VM 120 executes common instructions that belong to a setup suite to generate result 275 stored in memory 220 that is associated with parent VM 210. Once result 275 has been generated, parent VM 210 sets the application hook and server 420 sits idle waiting for an incoming instruction set from client 410. At some point, server 420 detects instruction set 265 from client 410 at 453. Upon detecting the instruction set, host system 102 forks clone VM 230 at 414. The clone VM 230 can access result 275 of parent VM 210. Once the fork has completed, clone VM 230 executes instruction set 265 at 425. Changes to result 275 from performing instruction set 265 are stored in result delta 295 of memory 240 which is associated with clone VM 230. Server 420 returns the results generated from execution of instruction set 265 to client 410 at 426.

Figure 5:
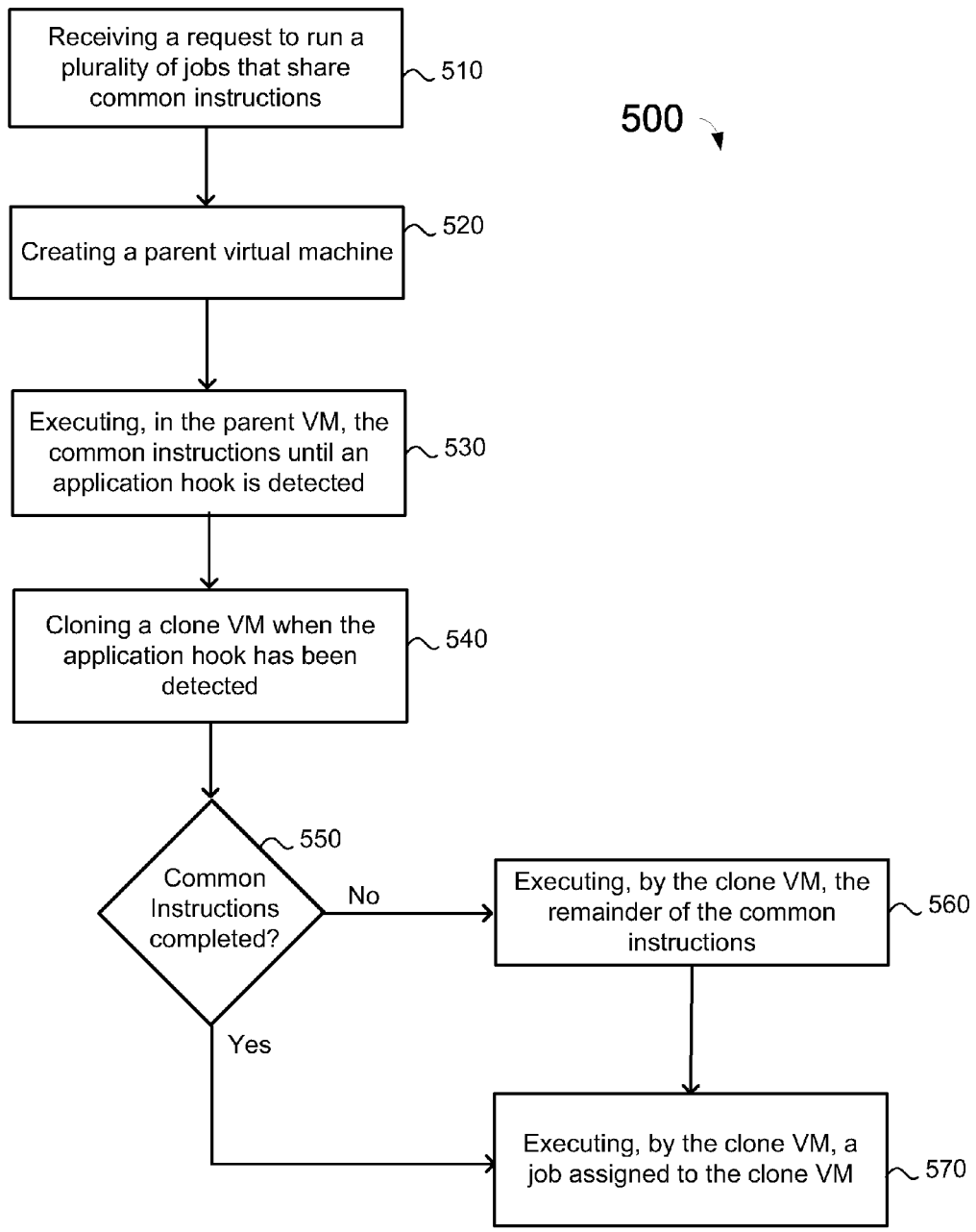
FIG. 5 depicts an example of a method to perform a verification process according to one embodiment.

FIG. 5 depicts a simplified flowchart 500 of a method to perform a verification process according to one embodiment. At 510, host 102 receives a request to run a plurality of jobs for the simulation. In one example, the plurality of jobs can be a plurality of tests for simulation on a circuit model and each job shares common instructions to generate or initialize the circuit model that is used in each job.

At 520, once the request is received, host 102 creates a parent VM 210. Host 102 can create parent VM 210 using the virtualization software (i.e., "hypervisor") to deploy parent VM 210. At 530, once host 102 creates parent VM 210, host 102 executes, in parent VM 210, the common instructions that are shared amongst the plurality of jobs until parent VM 210 detects an application hook. In one embodiment, parent VM 210 determines the application hook when a predefined allocation of memory for parent VM 210 has been reached. In another embodiment, parent VM 210 determines the application hook when a predefined allocation of memory on host 102 has been reached. In yet another embodiment, parent VM 210 determines the application hook upon completion of the common instructions.

At 540, once parent VM 210 detects the application hook, parent VM 210 clones one or more clone VMs 230. The clone command can be a VMFork command. By cloning parent VM 210, clone VM 230 can share the same memory and execution state as parent VM 210. Each clone VM 230 can have an OS virtual disk ("VDMK) and application binary VDMK that can be specified by the clone command. The host system in which the clone VM is created in can also be specified by the clone command. For example, a job that requires the VM to run on Linux OS can have a clone command with configuration settings specifying that the clone VM is to have a Linux OS VDMK and a Linux application binary VDMK. As another example, a job that requires a single virtual CPU can have a clone command with configuration setting specifying that the clone VM is to have access to one virtual CPU.

At 550, once the fork has occurred, each clone VM 230 can continue by detecting whether the common instructions were completed. If the common instructions were completed, then, at 570, each clone VM 230 executes a job assigned to each respective clone VM. Alternatively if the common instructions were not completed, at 560, each clone VM 230 can continue by executing the yet to be executed common instructions in each respective clone VM 230. At 570, once each clone VM 230 executes the remainder of the common instructions, each clone VM 230 executes the respective job assigned to the clone VM.

The embodiments described herein can employ various computer-implemented operations involving data stored in computer systems. For example, these operations can require physical manipulation of physical quantities—usually, though not necessarily, these quantities take the form of electrical or magnetic signals, where they (or representations of them) are capable of being stored, transferred, combined, compared, or otherwise manipulated. Such manipulations are often referred to in terms such as producing, identifying, determining, comparing, etc. Any operations described herein that form part of one or more embodiments can be useful machine operations.

Further, one or more embodiments can relate to a device or an apparatus for performing the foregoing operations. The apparatus can be specially constructed for specific required purposes, or it can be a general purpose computer system selectively activated or configured by program code stored in the computer system. In particular, various general purpose machines may be used with computer programs written in accordance with the teachings herein, or it may be more convenient to construct a more specialized apparatus to perform the required operations. The various embodiments described herein can be practiced with other computer system configurations including handheld devices, microprocessor systems, microprocessor-based or programmable consumer electronics, minicomputers, mainframe computers, and the like.

Yet further, one or more embodiments can be implemented as one or more computer programs or as one or more computer program modules embodied in one or more non-transitory computer readable storage media. The term non-transitory computer readable storage medium refers to any data storage device that can store data which can thereafter be input to a computer system. The non-transitory computer readable media may be based on any existing or subsequently developed technology for embodying computer programs in a manner that enables them to be read by a computer system. Examples of non-transitory computer readable media include a hard drive, network attached storage (NAS), read-only memory, random-access memory (e.g., a flash memory device), a CD (Compact Disc) (e.g., CD-ROM, CD-R, CD-RW, etc.), a DVD (Digital Versatile Disc), a magnetic tape, and other optical and non-optical data storage devices. The non-transitory computer readable media can also be distributed over a network coupled computer system so that the computer readable code is stored and executed in a distributed fashion.

In addition, while described virtualization methods have generally assumed that virtual machines present interfaces consistent with a particular hardware system, persons of ordinary skill in the art will recognize that the methods described can be used in conjunction with virtualizations that do not correspond directly to any particular hardware system. Virtualization systems in accordance with the various embodiments, implemented as hosted embodiments, non-hosted embodiments or as embodiments that tend to blur distinctions between the two, are all envisioned. Furthermore, certain virtualization operations can be wholly or partially implemented in hardware.

Many variations, modifications, additions, and improvements are possible, regardless the degree of virtualization. The virtualization software can therefore include components of a host, console, or guest operating system that performs virtualization functions. Plural instances can be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations can be implemented as a combined structure or component. Similarly, structures and functionality presented as a single component can be implemented as separate components.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of particular embodiments may be implemented. These examples and embodiments should not be deemed to be the only embodiments, and are presented to illustrate the flexibility and advantages of particular embodiments as defined by the following claims. Other arrangements, embodiments, implementations and equivalents can be employed without departing from the scope hereof as defined by the claims. While the examples above focus on running a test suite containing a plurality of test vectors, the techniques described are also applicable in other contexts. Broadly speaking, the techniques described can be applied to any group of instruction sets (e.g. test vectors) that are each associated with a sequence of common instructions (e.g., a set up suite). To run a first instruction set, the sequence of common instructions must first be performed. A first VM can run the sequence of common instructions to generate a result. As described above, the result generated from running the sequence of common instructions can be a model. Alternatively, the result can be the creation of an infrastructure for which a first instruction set is to be run on. The infrastructure can include tables, objects, or data structures that are created prior to execution of the first instruction set. As another example, the result can also be the initialization of one or more entries in a database or other data structure. The entries may need to be initialized before they can be manipulated by performing the first instruction set. Subsequent VMs cloned from the first VM have access to the results generated from executing the sequence of common instructions. As a result, instruction sets that are run on cloned VMs have the benefit of using the results generated by the first VM as a starting point for the execution of the instruction set.

What is claimed is:

1. A computer-implemented method, comprising: receiving, by a computer system, a request to run a plurality of tests, the plurality of tests including a set of instruction sets that are associated with a sequence of common instructions;
creating, by the computer system, a first virtual machine (VM), wherein the first VM is created upon receiving the request;
executing, by the computer system, a portion of the sequence of common instructions in the first VM, wherein at least a portion of the sequence of common instructions generates a first result;
storing, by the computer system, the first result in a first memory page accessible by the first VM;
determining, by the computer system, a point in the plurality of tests to clone a set of second VMs;
cloning, by the computer system, the set of second VMs using a state of the first VM, the set of second VMs sharing the first memory page with the first VM such that the first memory page is accessible by the set of second VMs for accessing the first result; and
executing, by the computer system and in the set of second VMs, a set of instruction sets associated with a remainder of the sequence of common instructions that were not executed by the first VM, wherein the set of second VMs execute the set of instruction sets from the plurality of tests using the first result stored in the first memory page as a starting point from which the set of second VMs execute the set of instruction sets, wherein the first memory page is shared by the first VM and the set of second VMs such that there is a single shared instance of the first result stored in the first memory page and accessible by the set of second VMs during execution of the set of instruction sets, wherein each of the set of instruction sets uses the single shared instance of the first result to generate a set of second results for the plurality of tests without executing the sequence of common instructions previously executed by the first VM, and wherein the first VM remains in a steady state such that the first result remains unchanged during execution of the set of instruction sets by the set of second VMs.

2. The computer-implemented method of claim 1, wherein the sequence of common instructions comprises a first sequence of common instructions, the method further comprising:
executing, in the set of second VMs, a second sequence of common instructions before running the set of instruction sets.

3. The computer-implemented method of claim 1, further comprising:
determining, by the computer system, that a second result in the set of second results will modify the first result stored in the first memory page; and
storing, by the computer system, a difference between the first result and the second result in a second memory page associated with a second VM in the set of second VMs without modifying the first result.

4. The computer-implemented method of claim 1, wherein the first result is a run-time model of a circuit and the sequence of common instructions is configured to initialize or reset the run-time model for the plurality of tests.

5. The computer-implemented method of claim 1, wherein the point to clone is determined by evaluating whether a predefined memory allocation has been reached.

6. The computer-implemented method of claim 1, wherein a test in the plurality of tests includes configuration settings, and wherein a second VM in the set of second VMs is cloned according to the configuration settings associated with an instruction set in the set of instruction sets.

7. The computer-implemented method of claim 1, wherein the first VM remains in the steady state upon cloning the set of second VMs such that the first result remains unchanged for use by the set of second VMs.

8. The method of claim 1, further comprising:
determining whether the sequence of common instructions were completed;
when the sequence of common instructions were not completed, executing, by the computer system and in the set of second VMs, a remainder of the sequence of common instructions before executing the set of instruction sets; and
when the sequence of common instructions were completed, proceeding to execute the set of instruction sets.

9. The method of claim 1, wherein the point to clone is determined by the first VM based on a completion of the sequence of common instructions.

10. A non-transitory computer readable storage medium containing instructions, that when executed, control a computer system to be configured for:
receiving a request to run a plurality of tests, the plurality of tests including a set of instruction sets that are associated with a sequence of common instructions;
creating, by the computer system, a first virtual machine (VM), wherein the first VM is created upon receiving the request;
executing a portion of the sequence of common instructions in the first VM, wherein at least a portion of the sequence of common instructions generates a first result;
storing the first result in at least one shared memory page accessible by the first VM;
determining a point in the plurality of tests to clone a set of second VMs;
cloning the set of second VMs using a state of the first VM stored in the at least one shared memory page, wherein the at least one shared memory page is accessible by the set of second VMs; and
executing, in the set of second VMs, a set of instruction sets associated with a remainder of the sequence of common instructions that were not executed by the first VM, the set of second VMs sharing the at least one shared memory page with the first VM, wherein the set of second VMs execute the set of instruction sets from the plurality of tests using the first result stored in the at least one shared memory page as a starting point from which the set of second VMs execute the set of instruction sets, such that there is a single shared instance of the first result stored in the at least one shared memory page and accessible by the set of second VMs during execution of the set of instruction sets, wherein each of the set of instruction sets uses the single shared instance of the first result to generate a set of second results for the plurality of tests without executing the sequence of common instructions previously executed by the first VM, and wherein the first VM remains in a steady state such that the first result remains unchanged during execution of the set of instruction sets by the set of second VMs.

11. The non-transitory computer readable storage medium of claim 10, wherein the sequence of common instructions comprises a first sequence of common instructions, further configured for:
executing, in the set of second VMs, a second sequence of common instructions before running the set of instruction sets.

12. The non-transitory computer readable storage medium of claim 10, further configured for:
determining that a second result in the set of second results will modify the first result stored in the at least one shared memory page: and
storing a difference between the first result and the second result in at least one second memory page associated with a second VM in the set of second VMs without modifying the first result.

13. The non-transitory computer readable storage medium of claim 10, wherein the first result is a run-time model of a circuit and the sequence of common instructions is configured to initialize or reset the run-time model for the plurality of tests.

14. The non-transitory computer readable storage medium of claim 10, wherein the point to clone is determined by evaluating whether a predefined memory allocation has been reached.

15. The non-transitory computer readable storage medium of claim 10, wherein a test in the plurality of tests includes configuration settings, and wherein a second VM in the set of second VMs is cloned according to the configuration settings associated with an instruction set in the set of instruction sets.

16. The non-transitory computer readable storage medium of claim 10, wherein the first VM remains in the steady state upon cloning the set of second VMs such that the first result remains unchanged for use by the set of second VMs.

17. An apparatus, comprising:
one or more computer processors;
and a non-transitory computer-readable storage medium comprising instructions, that when executed, control the one or more computer processors to be configured for:
receiving a request to run a plurality of tests, the plurality of tests including a set of instruction sets that are associated with a sequence of common instructions;
creating, by the one or more computer processors, a first virtual machine (VM), wherein the first VM is created upon receiving the request;
executing a portion of the sequence of common instructions in the first VM, wherein at least a portion of the sequence of common instructions generates a first result;
storing the first result in a first memory page accessible by the first VM;
determining a point in the plurality of tests to clone a set of second VMs;
cloning the set of second VMs using a state of the first VM, the set of second VMs sharing the first memory page with the first VM such that the first memory page is accessible by the set of second VMs for accessing the first result; and
executing, in the set of second VMs, a set of instruction sets associated with a remainder of the sequence of common instructions that were not executed by the first VM, wherein the set of second VMs execute the set of instruction sets from the plurality of tests using the first result stored in the first memory page as a starting point from which the set of second VMs execute the set of instruction sets, wherein the first memory page is shared by the first VM and the set of second VMs such that there is a single shared instance of the first result stored in the first memory page and accessible by the set of second VMs during execution of the set of instruction sets, wherein each of the set of instruction sets uses the single shared instance of the first result to generate a set of second results for the plurality of tests without executing the sequence of common instructions previously executed by the first VM, and wherein the first VM remains in a steady state such that the first result remains unchanged during execution of the set of instruction sets by the set of second VMs.

18. The apparatus of claim 17, wherein the sequence of common instructions comprises a first sequence of common instructions, further configured for:
executing, in the set of second VMs, a second sequence of common instructions before running the set of instruction sets.

19. The apparatus of claim 17, further configured for:
determining that a second result in the set of second results will modify the first result stored in the first memory page: and
storing a difference between the first result and the second result in a second memory page associated with a second VM in the set of second VMs without modifying the first result.

20. The apparatus of claim 17, wherein the first result is a run-time model of a circuit and the sequence of common instructions is configured to initialize or reset the run-time model for the plurality of tests.

21. The apparatus of claim 17, wherein the point to clone is determined by evaluating whether a predefined memory allocation has been reached.

22. The apparatus of claim 17, wherein a test in the plurality of tests includes configuration settings, and wherein a second VM in the set of second VMs is cloned according to the configuration settings associated with an instruction set in the set of instruction sets.

23. The apparatus of claim 17, wherein the first VM remains in the steady state upon cloning the set of second VMs such that the first result remains unchanged for use by the set of second VMs.

* * * * *